(12) United States Patent
Marini et al.

(10) Patent No.: US 10,122,274 B2
(45) Date of Patent: Nov. 6, 2018

(54) MULTI-FUNCTION POWER CONTROL CIRCUIT USING ENHANCEMENT MODE GALLIUM NITRIDE (GAN) HIGH ELECTRON MOBILITY TRANSISTORS (HEMTS)

(71) Applicant: FREEBIRD SEMICONDUCTOR CORPORATION, Haverhill, MA (US)

(72) Inventors: Anthony G. P. Marini, Clinton, MA (US); James L. Larrauri, North Port, FL (US); Simon P. Wainwright, Newburyport, MA (US); Max Zafrani, Swampscott, MA (US)

(73) Assignee: Freebird Semiconductor Corporation, Haverhill, MA (US)

( * ) Notice: Subject to any disclaimer, the term of this patent is extended or adjusted under 35 U.S.C. 154(b) by 12 days.

(21) Appl. No.: 15/374,756

(22) Filed: Dec. 9, 2016

(65) Prior Publication Data

US 2017/0170731 A1   Jun. 15, 2017

Related U.S. Application Data

(60) Provisional application No. 62/275,575, filed on Jan. 6, 2016, provisional application No. 62/266,083, filed
(Continued)

(51) Int. Cl.
*H02M 3/158* (2006.01)
*H02M 1/32* (2007.01)
(Continued)

(52) U.S. Cl.
CPC ............ *H02M 3/158* (2013.01); *G01R 15/04* (2013.01); *G01R 19/16504* (2013.01);
(Continued)

(58) Field of Classification Search
CPC .. H02M 3/156; H02M 3/1588; H02M 3/1584; H02M 3/158; H02M 3/157;
(Continued)

(56) References Cited

U.S. PATENT DOCUMENTS 3,912,948 A   10/1975   Bapat
5,408,150 A   4/1995   Wilcox
(Continued)

FOREIGN PATENT DOCUMENTS

WO   2015135072 A1   9/2015

OTHER PUBLICATIONS

Search Report and Written Opinion dated Mar. 22, 2017 in PCT/US2016/065946.
(Continued)

*Primary Examiner* — Jue Zhang
*Assistant Examiner* — Kevin H Sprenger
(74) *Attorney, Agent, or Firm* — Brown Rudnick LLP

(57) ABSTRACT

Embodiments of the present disclosure relate to a multi-function circuit. The circuit comprises a low side circuit that is comprised with a first set of enhancement mode transistors. The half bridge circuit also includes a high side circuit that is comprised of a second set of transistors. Each of the enhancement mode transistors of the first set and second set of enhancement mode transistors are Gallium Nitride (GaN) transistors. In some embodiments, the GaN transistors are High Electron Mobility Transistors (HEMTs). In additional embodiments, the GaN transistors are configured and operated as saturated switches. In further embodiments, the half bridge circuit is designed as a discrete circuit. Additionally, each of the first set and second set of transistors, diodes, resistors, and all passive elements are discrete components arranged to form a half bridge circuit. In fact, the entire half bridge circuit is built from discrete components.

15 Claims, 10 Drawing Sheets

Related U.S. Application Data on Dec. 11, 2015, provisional application No. 62/266,086, filed on Dec. 11, 2015, provisional application No. 62/266,094, filed on Dec. 11, 2015, provisional application No. 62/266,099, filed on Dec. 11, 2015.

(51) Int. Cl.

| | | |
|---|---|---|
| *G01R 15/04* | (2006.01) | |
| *G01R 19/165* | (2006.01) | |
| *H01L 29/20* | (2006.01) | |
| *H01L 29/778* | (2006.01) | |
| *H03K 17/0812* | (2006.01) | |

(52) U.S. Cl.
CPC ...... *H01L 29/2003* (2013.01); *H01L 29/7783* (2013.01); *H02M 1/32* (2013.01); *H03K 17/08122* (2013.01)

(58) Field of Classification Search
CPC ..... H02M 3/33507; H02M 2001/0012; H02M 2001/0032; H02M 2001/0009; Y02B 70/1466
USPC .................................................. 323/282–285
See application file for complete search history.

(56) References Cited

U.S. PATENT DOCUMENTS

| | | | |
|---|---|---|---|
| 5,594,380 | A | 1/1997 | Nam |
| 6,002,269 | A | 12/1999 | Dartnell et al. |
| 6,025,751 | A | 2/2000 | Chiang et al. |
| 7,254,000 | B1 | 8/2007 | Smith et al. |
| 7,294,992 | B2 | 11/2007 | Yoshikawa |
| 7,705,676 | B2 | 4/2010 | Kirchmeier et al. |
| 8,243,476 | B2 | 8/2012 | Ribarich |
| 8,593,211 | B2 | 11/2013 | Forghani-Zadeh et al. |
| 9,577,530 | B1 * | 2/2017 | Ribarich ............... H02M 3/158 |
| 9,685,869 | B1 * | 6/2017 | Kinzer ................ H02M 3/1588 |
| 2012/0049827 | A1 | 3/2012 | Hirose |
| 2012/0250201 | A1 | 10/2012 | Johansson et al. |
| 2013/0207123 | A1 | 8/2013 | Henning et al. |
| 2013/0241621 | A1 | 9/2013 | Forghani-Zadeh et al. |
| 2014/0070786 | A1 * | 3/2014 | Guerra ................... G05F 1/618 323/285 |
| 2015/0137619 | A1 | 5/2015 | Seeman et al. |
| 2015/0162832 | A1 * | 6/2015 | Briere ................. H01L 27/0255 323/271 |
| 2015/0243737 | A1 | 8/2015 | Escoffier |
| 2016/0049786 | A1 | 2/2016 | Kinzer |
| 2016/0079844 | A1 | 3/2016 | Kinzer et al. |
| 2016/0079975 | A1 | 3/2016 | Kinzer et al. |
| 2016/0233859 | A1 | 8/2016 | Roberts et al. |
| 2017/0012626 | A1 * | 1/2017 | Dighrasker ............ H03K 17/08 |
| 2017/0324263 | A1 * | 11/2017 | Kinzer ................ H02M 3/1588 |

OTHER PUBLICATIONS

Colino and Beach, "Fundamentals of Gallium Nitride Power Transistors," GaN Power Transistors, Application Note: AN002, 2011 (4 PAGES).
GaN Systems, Application Note, "How to Drive GaN Enhancement Mode Power Switching Transistors," GN001 Rev. Oct. 21, 2014.
Wang, "An Efficient High-Frequency Drive Circuit for GaN Power HFETs," IEEE Transactions on Industry Applications, vol. 45, No. 2, Mar./Apr. 2009.
Marini, "Applying MiGaN,TM GaN Devices in High Reliability and Space Applications for Maximum Performance and Reliability," Microsemi Corporation, Aliso Viejo, CA (Rev. Nov. 2013).
Lidow and Strydom, "Gallium Nitride (GaN) Technology Overview," GaN Technology Overview, White Paper: WP001, EPC—Efficient Power Conversion Corporation (2012).
Search Report and Written Opinion dated Mar. 13, 2017 in PCT/US2016/065952.

\* cited by examiner

MULTI-FUNCTION POWER CONTROL CIRCUIT USING ENHANCEMENT MODE GALLIUM NITRIDE (GAN) HIGH ELECTRON MOBILITY TRANSISTORS (HEMTS)

RELATED APPLICATIONS

This application claims the benefit of U.S. Provisional Application No. 62/266,083, filed on Dec. 11, 2015, U.S. Provisional Application No. 62/266,086, filed on Dec. 11, 2015, U.S. Provisional Application No. 62/266,094, filed on Dec. 11, 2015, U.S. Provisional Application No. 62/266,099, filed on Dec. 11, 2015 and U.S. Provisional Application No. 62/275,575, filed on Jan. 6, 2016.

The entire teachings of the above applications are incorporated herein by reference.

BACKGROUND

Electronic devices such as computers, servers, printers, motor controllers and televisions, among others, employ one or more electrical power conversion circuits to convert one form of electrical energy to another. Some electrical power conversion circuits convert a high DC voltage to a lower DC voltage using a variety of power switching circuit topologies. An example topology is one that is consistent with a half bridge converter. As many electronic devices are sensitive to the size and efficiency of the power conversion circuit, new converter circuits and components may be required to meet the needs of new electronic devices.

SUMMARY

Embodiments of the present disclosure relate to a multi-function circuit. The circuit comprises a low side circuit comprised of a first set of enhancement mode transistors, and a high side circuit comprised of a second set of enhancement mode transistors. Each enhancement mode transistor of both the first and the second sets of enhancement mode transistors are GaN high electron mobility transistors (HEMTs).

The low side circuit can include a GaN low side power switch having a low side switch control gate. The low side switch control gate can form a low side subordinate half bridge circuit configured to directly drive the low side power switch control gate.

The high side circuit can include a GaN high side power switch having a high side switch control gate. The high side switch control gate can form a high side subordinate half bridge circuit configured to directly drive the high side power switch control gate.

The multi-function circuit can further comprise a first rectifier diode and a second rectifier diode. The first and second rectifier diodes can have an anti-parallel configuration with respect to both the GaN low side power switch and the GaN high side power switch.

The low side subordinate half bridge circuit can include a low side subordinate half bridge high side switch. The multi-function circuit can further comprise a first bootstrap circuit in electrical communication with the low side subordinate half bridge high side switch. The first bootstrap circuit can be configured to act as a charge pump to control an on/off state of the low side subordinate half bridge high side switch.

The multi-function circuit can also comprise a bias path from a voltage bias input terminal through the first bootstrap circuit to a low side subordinate half bridge low side switch. The bias path can be configured to charge a capacitor of the bootstrap circuit for controlling the on/off state of the low side subordinate half bridge high side switch.

The multi-function circuit can further comprise a delay circuit connecting the bootstrap circuit to the low side subordinate half bridge high side switch. The delay circuit can be configured to control a timing of a change in the on/off state of the low side subordinate half bridge high side switch in response to a change in the on/off state of the low side subordinate half bridge low side switch.

The multi-function circuit of claim can also further comprise a capacitor bypass circuit in electrical communication with a drain of the low side subordinate half bridge high side switch and a source of the low side subordinate half bridge low side switch. The bypass circuit can be configured to provide high frequency charge storage for a current required by the GaN HEMT low side power switch. The bypass capacitor can be in electrical communication with a bias power supply and configured to utilize a voltage blocking diode to provide a charging path to ground potential for the bootstrap capacitor. A blocking diode can be configured to conduct capacitor charging current when a high side power switch is off. The blocking diode can be further configured to block bypass capacitor discharge current when the high side power switch is on.

The high side subordinate half bridge circuit can include a high side subordinate half bridge high side switch. The multi-function circuit can further comprise a second bootstrap circuit in electrical communication with the high side subordinate half bridge high side switch. The second bootstrap circuit can be configured to act as a charge pump to control an on/off state of the high side subordinate half bridge high side switch.

The high side subordinate half bridge circuit can include a bias controller in electrical communication with the high side subordinate half bridge high side switch. The bias controller can be further configured to electrically communicate ground potential-based state control and timing signal delays to the high side subordinate half bridge via a state controller circuit.

The high side subordinate half bridge circuit can include a state controller in electrical communication with the high side subordinate half bridge high side switch. The state controller can further be configured to provide ON/OFF logic state information to the high side subordinate half bridge circuit.

The multi-function circuit can further comprise a voltage level-shifter/inverter configured to provide OFF/ON state information from a ground potential-based logic control input in electrical communication with the high side power switch driver. The voltage level-shifter/inverter can be configured to control an OFF/ON state of the GaN high side power switch.

An entirety of the multi-function circuit can be comprised of discrete enhancement-mode GaN circuitry. In addition, both the low side circuit and the high side circuit can be composed of discrete electronic components.

Another embodiment of the present disclosure related to a multi-function circuit comprising a low side circuit including a GaN-based low side subordinate half bridge circuit and a high side circuit including a GaN-based high side subordinate half bridge circuit.

In a further embodiment of the present disclosure, a multi-function circuit comprises a GaN-based low side circuit. The GaN-based low-side circuit includes a GaN-based low side switch having a low side switch control gate.

The low side switch control gate forms a low side subordinate half bridge circuit. The GaN-based low-side circuit also includes a GaN-based low side switch driver having an output connected to the low side switch control gate. The multi-function circuit further comprises a GaN-based high side circuit including a GaN-based high side switch having a high side switch control gate. The high side switch control gate forms a high side subordinate half bridge circuit. In addition, the GaN-based high side circuit includes a GaN-based high side switch driver having an output connected to the high side switch control gate.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DESCRIPTION

Figure 1:
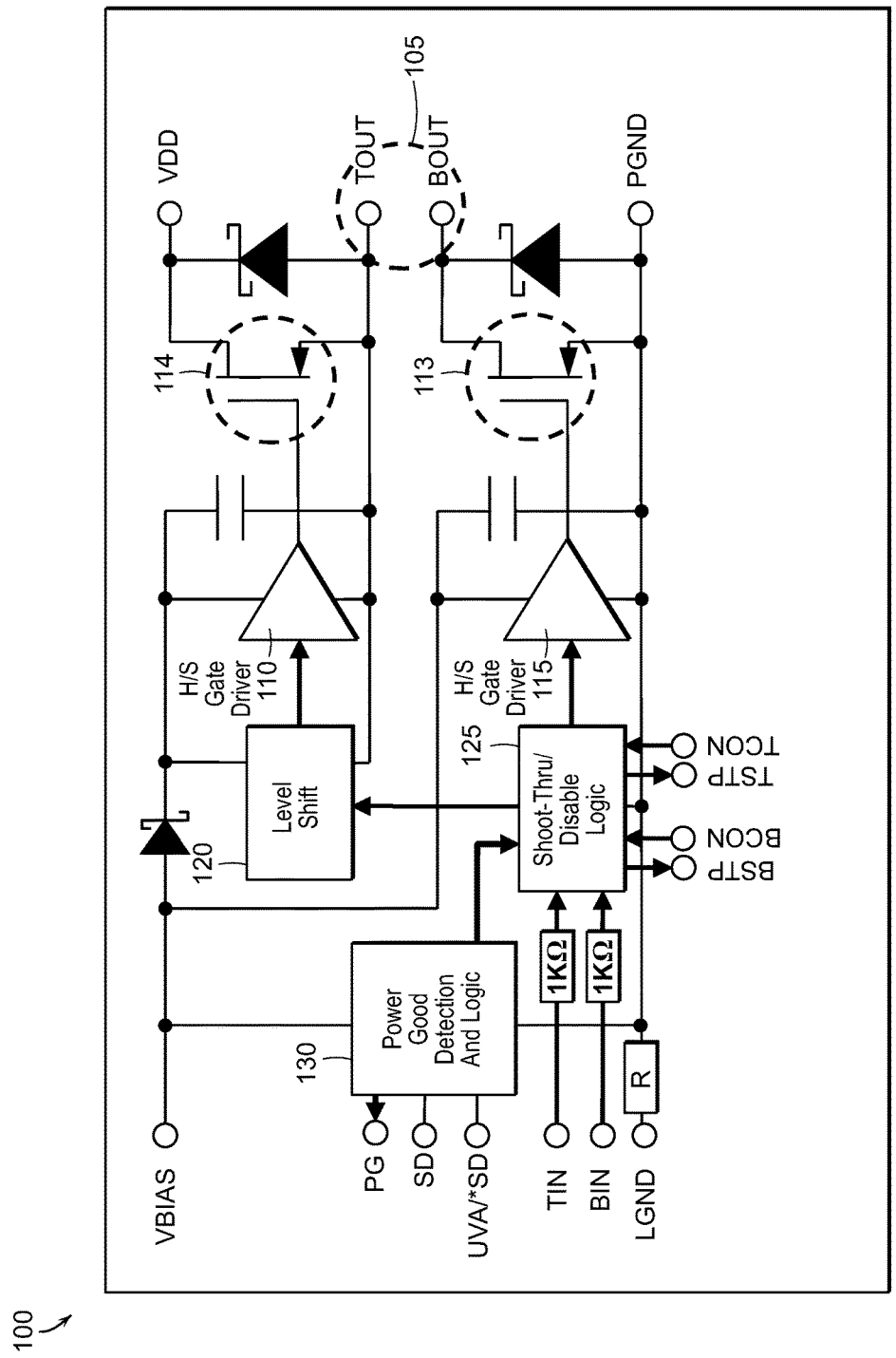
FIG. 1 is a logical block diagram of a multi-function enhancement mode GaN HEMT power control circuit according to an embodiment of the present disclosure.

A description of example embodiments of the present disclosure follows.

Gallium Nitride (GaN) is a semiconductor material that is maturing at a rapid rate for use in electronic circuits. The properties of GaN materials are superior, in many cases, to existing semiconductor materials systems such as Germanium, Gallium Arsenide, Silicon Carbide and Silicon. Accordingly, GaN can be implemented in circuits as high speed, radiation tolerant transistors.

GaN High Electron Mobility Transistors (HEMTs) are available in two types: depletion mode devices (which are normally on) and enhancement mode devices (which are normally off). Depletion mode GaN HEMTs are commonly used in radio frequency applications in which they are typically biased on at a fixed voltage and current level. A radio frequency signal is then superimposed on top of that biasing condition. The GaN HEMTs do not switch from on state to off-state in this case. Enhancement mode GaN HEMTs are normally off. A gate of a GaN HEMT needs to be enhanced by a voltage at its control gate to enable current flow between source contacts and drain contacts of the GaN HEMT. A margin between a voltage needed to be applied to the control gate to turn on the GaN HEMT and the maximum voltage permitted on the control gate is very small. Accordingly, this small margin poses a number of issues in the switching mode operation of GaN HEMTs. Embodiments of the present disclosure addresses the issues of driving a GaN enhancement mode switch within the concept of a multi-function power driver circuit. Enhancement mode HEMTs are generally configured as saturated switches.

In particular, embodiments of the present disclosure relate to driver circuits that use only GaN transistors (no silicon transistors) both in a low side driver topology and a high side driver topology. The topologies of these two driver elements can be combined into a GaN half-bridge driver in some embodiments of the present disclosure.

Because a GaN material is a wide band gap material, GaN is intrinsically better for radiation hardened environments. Accordingly, embodiments of the present disclosure allow for increased radiation tolerance as compared to silicon Metal Oxide Semiconductor Field Effect Transistor (MOSFET) systems.

An objective of the present disclosure is to provide a drive circuit designed to drive GaN power switches, where the drive circuit eliminates all silicon based transistors. In particular, an objective is to demonstrate that, by using n-channel GaN enhancement mode HEMTs only, a low side driver and a high side driver can be designed and realized using only GaN HEMTs.

Advantageously, the size of the drivers and power management systems disclosed herein can be reduced significantly because GaN transistors are smaller than silicon transistors for a given on-state resistance. Thus, the power density of the circuit designs disclosed herein is greater than presently-employed circuit designs.

Additionally, the circuit designs, using only GaN transistors, disclosed herein are able to switch at higher frequencies because GaN semiconductor materials, in addition to other known benefits, have greater electron mobility and are a wider bandgap material. In addition to the benefits of a GaN semiconductor material, a HEMT transistor requires less gate charge to drive the transistor from one state (on/off) to another (off/on). Thus, the driver circuitry, including both active and passive components, can be correspondingly smaller because the individual components are required to handle less power due to the lower gate charge value. Accordingly, embodiments of the present disclosure can achieve circuit designs having a much smaller size than conventional designs. The decreased value of the passive components also contributes to increased system power density of embodiments of the present disclosure.

Because GaN materials have a high degree of radiation hardness, the circuit designs disclosed herein have a degree of radiation hardness that is greater than present circuit designs. As such, embodiments of the present disclosure can be applied to various space and military applications that require a high degree of radiation hardness.

FIG. 1 is a logical block diagram of a multi-function circuit 100. The multi-function circuit 100 can be configured to operate as a half-bridge driver circuit. In such a configuration, the multi-function circuit 100 drives complementary power transistors (e.g., power switches) 113-114. The power switches 113-114 can be Gallium Nitride (GaN) enhancement mode high electron mobility transistors (HEMTs). Further, each transistor comprising the entire multi-function circuit 100 can be a GaN HEMT. Each of the transistors can further be configured as saturated switches.

The first power switch (e.g., the high-side power switch) 114 is referenced to an output voltage terminal 'TOUT'. In addition, the first power switch 114 is in electrical communication with an input power supply terminal 'VDD'. The first power switch 114 is further connected to a first driver circuitry (e.g., a high-side circuit) that includes a first high speed gate driver 110, level shift circuitry 120, and shoot-thru/disable logic circuitry 125. The first driver circuitry is configured to control the first power switch 114 (i.e., change an "ON/OFF" state of the first power switch 114).

The second power switch (e.g., the low-side power switch) 113 is referenced to a ground terminal 'PGND'. Additionally, the second power switch 114 is in electrical communication with an output terminal 'BOUT'. The second power switch is further connected to a second driver circuitry (e.g., a low-side circuit) that includes a second high speed driver 115 and shoot-thru/disable logic circuitry 125. The second driver circuitry is configured to control the second power switch 114 (i.e., change an "ON/OFF" state of the first power switch 114).

The first driver circuitry and the second driver circuitry can be configured as independent driving circuits. For example, each of the first driver circuitry and second driver circuitry can be single independent discrete circuits. Alternatively, each of the first driver circuitry and second driver circuitry can be configured in a single discrete circuit as independently operating high side and low side circuits, respectively. In other configurations, the first driver circuitry and second driver circuitry can be configured as a half-bridge converter circuit. In a half-bridge configuration, the output terminal 'TOUT' and the output terminal 'BOUT' may be electrically connected as a single output terminal 105 to drive an external load.

An optional power good detection and logic detection circuit 130 is in electrical communication with both the first driver circuitry and the second driver circuitry. The power good detection and logic detection circuit 130 is configured to identify either an under voltage and/or an over voltage state of either or both of the first driver circuitry and the second driver circuitry.

Figure 2A:
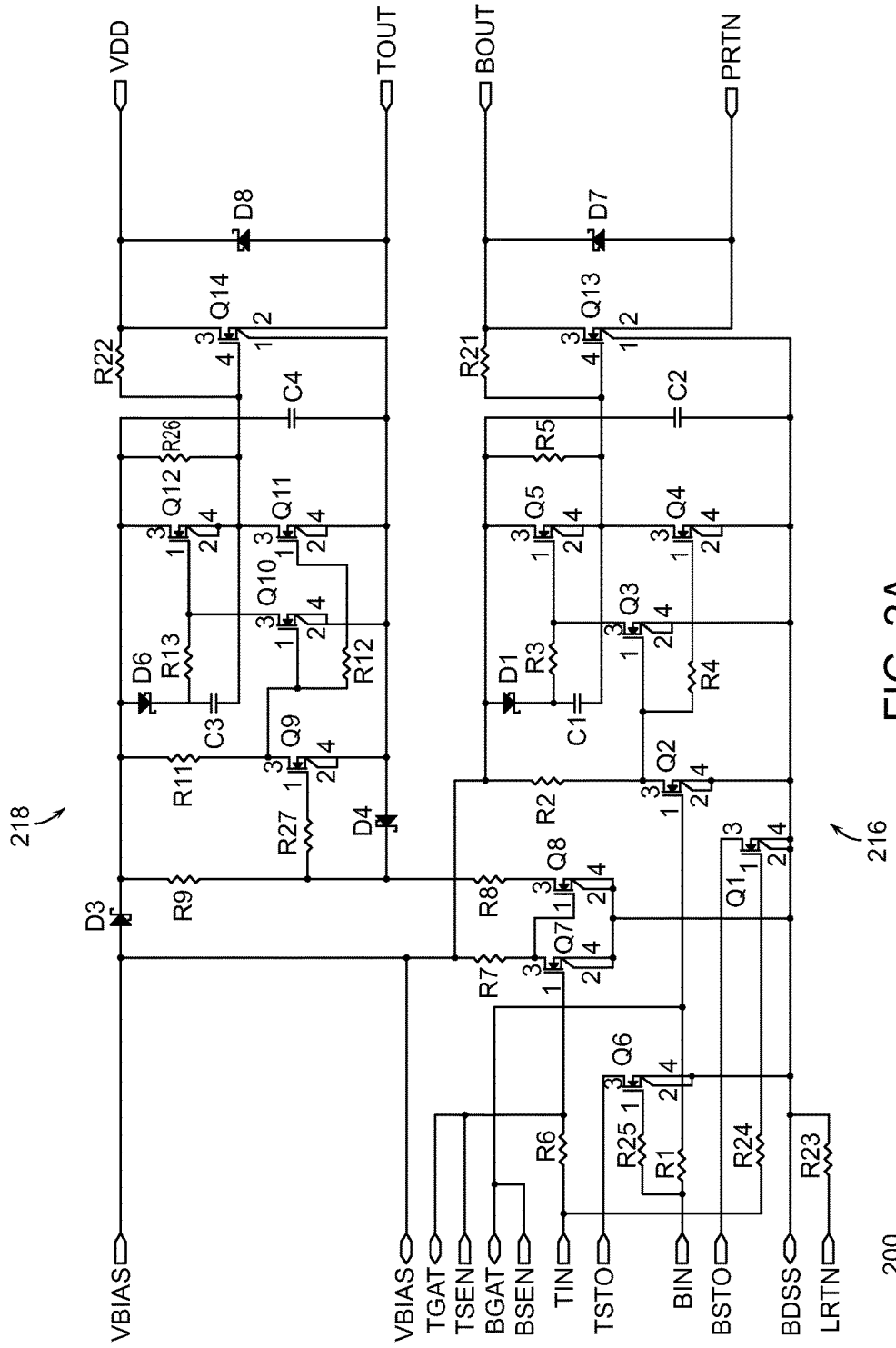
FIG. 2A is a circuit diagram of a multi-function enhancement mode GaN HEMT power control circuit configuration according to an example embodiment of the present disclosure.

FIG. 2A is a circuit diagram of a multi-function circuit (e.g., the circuit 100 of FIG. 1) that is in a half-bridge driver circuit configuration 200. As illustrated, the half-bridge driver circuit 200 includes a plurality of transistors 'Qx', diodes 'Dx', capacitors 'Cx', and resistors 'Rx'. In this example, the half-bridge circuit 200 is configured as a discrete circuit and each of the of transistors 'Qx', diodes 'Dx', capacitors 'Cx', and resistors 'Rx' are discrete components arranged to form the discrete half-bridge circuit 200. Further, each of the transistors 'Qx' are GaN High Electron Mobility Transistors (HEMTs). Each of the transistors 'Qx' can also be configured as a saturated switch in this configuration of the half-bridge driver circuit 200. The diodes 'Dx' can be Schottky rectifiers with appropriate current and voltage ratings with respect to an intended use of the multi-function driver circuit 200. The capacitors 'Cx' are passive ceramic devices and the resistors 'Rx' are passive devices.

The multi-function driver circuit 200 includes a low-side power switch (Q13) and a high-side power switch (Q14). The circuit 200 is also provided with Schottky "catch" rectifier diodes (D8, D9) connected anti-parallel with each of the power switches (Q13, Q14). These catch rectifier diodes (D8, D9) catch the voltage excursions of an output terminal (BOUT or TOUT) when load current either flows out of diode (D8) or into diode (D9), the output terminals (BOUT or TOUT) and both power switches (Q13, Q14) are in an OFF-state. The high-side power switch (Q14) is referenced to an output TOUT. The low-side power switch (Q13) is referenced to a ground terminal (GROUND).

The low-side power switch (Q13) is electrically coupled to low-side circuitry 216. The low-side circuitry 216 includes transistors (Q1-Q5) that are configured as power driver for driving the low-side power switch (Q13). In particular, the transistors (Q1-Q5) and associated active and passive components are configured as a high speed gate driver for the power switch (Q13). For instance, the low-side circuitry 216 includes a control gate that includes a switch driver (Q5, Q4), bootstrap circuit/bias control (D1, R3, C1), state controller (Q2, Q3), and an inverter (Q1). The control gate is configured to drive the low-side power switch (Q13). In this implementation, the components of the control gate are arranged as a subordinate half-bridge driver that is configured to drive the power switch (Q13).

For example, the subordinate half-bridge driver includes the switch drive transistors (Q5, Q4). The transistor (Q5) is effectively the low-side subordinate half bridge high-side power switch. This subordinate half-bridge high-side power switch (Q5) is configured to drive the low side power switch (Q13): when Q5 is on the gate of Q13 is effectively connected to the gate power source 'VBIAS', turning Q13 on. The state of the low-side subordinate half bridge high-side power switch (Q5) is controlled by the bootstrap circuit (D1, R3, C1). The bootstrap circuit (D1, R3, C1) is configured as a charge pump for the low-side subordinate half bridge high-side power switch (Q5).

The transistor (Q4) is effectively the low-side subordinate half bridge low-side power switch: when Q4 is on the gate of Q13 is effectively connected to its source, turning Q13 off.

A state controller (Q2, Q3) is in electrical communication with the switch drivers (Q5, Q4) and is configured to control their state. In particular, they are configured, along with resistors R2 and R4, to act as a "shoot-through" or cross-conduction prevention circuit to prevent both of the switch drivers (Q5, Q4) from being turned on at the same time (simultaneously).

Similarly, the transistor (Q1) is configured to prevent the low side power driver 216 from being turned on when a high side power driver 218 has been turned on.

In addition, the low-side circuitry 216 includes a bypass capacitor (C2), which is in electrical communication with the low-side power switch (Q13). The bypass capacitor (C2) is configured as a high frequency power supply "bypass" capacitor to provide high frequency charge storage for the low-side gate driver circuit 216.

The high-side power switch (Q14) is electrically coupled to high-side circuitry 218. The high-side circuitry 218 includes transistors (Q6-Q12) that are configured as a power driver for driving the high-side power switch (Q14). In particular, the transistors (Q6-Q12) and associated active and passive components (e.g., the capacitors, resistors, and diodes) are configured as a high speed gate driver for power switch (Q14). For instance, the high-side circuitry 218 includes a high-side control gate that includes a high-side switch driver (Q12, Q11), high-side bootstrap circuit/bias control (D6, R13, C3), high-side state controller (Q9, Q10), and a high-side inverter (Q7). The high-side control gate is configured to drive the high-side power switch (Q14). In this implementation, the components of the control gate are arranged as a high-side subordinate half-bridge driver that is configured to drive the power switch (Q14).

For example, the subordinate half-bridge driver includes the switch drive transistors (Q12, Q11). The transistor (Q12) is effectively the high-side subordinate half bridge high-side power switch. This subordinate half-bridge high-side power switch (Q12) is configured to drive the high side power switch (Q14): when Q12 is on the gate of Q14 is effectively connected to the gate power source 'VBOOTSTRAP' (where 'VBOOTSTRAP'="VBIAS"–Vf(D3)), turning Q14 on. The state of the low-side subordinate half bridge high-side power switch (Q12) is controlled by the bootstrap circuit (D6, R13, C3). The bootstrap circuit (D6, R13, C3) is configured as a charge pump for the high-side subordinate half bridge high-side power switch (Q12).

The transistor (Q11) is effectively the high-side subordinate half bridge low-side power switch: when Q11 is on the gate of Q14 is effectively connected to its source, turning Q14 off.

The high-side state controller (Q9, Q10) is in electrical communication with the high-side switch drivers (Q12, Q11) and is configured to control their state. In particular, they are configured to act as a "shoot-through" or cross-conduction prevention circuit to prevent both of the switch drivers (Q12, Q11) to be turned on at the same time (simultaneously).

The transistor (Q6) is configured to prevent the high-side power driver 218 from being turned on when the low-side power driver 216 has been turned on.

In addition, the high-side circuitry 218 includes a bypass capacitor C4 is in electrical communication with the high-side power switch (Q14). The bypass capacitor (C4) is configured as a high frequency power supply "bypass" capacitor to provide high frequency charge storage for the high-side gate driver circuit 218. The capacitor C4 is also configured as a bootstrap capacitor configured to store sufficient charge to provide a transient bias potential to the high-side power driver at times when Q14 is on and C4 has no electrical connection to ground.

FIG. 2A also includes a small value resistor (R27) (<100Ω) to couple the gate of (Q9) to an input signal conditioning circuit (R8, R9, and D4).

At a high-side driver 219 turn-ON, transistor (Q8) is OFF which allows resistor (R9) to pull up a node to which the cathode of (D4) is connected. There is a capacitance associated with the input capacitance of Q9 (Ciss) and R9 that creates a small delay in the turn-ON of transistor (Q9). After this delay, transistor (Q9) turns on and a turn-ON sequence for the high-side driver 219 described in FIG. 5 occurs.

At high-side driver 216 turn-OFF, transistor (Q8) is ON which causes sufficient current to flow through resistor (R9) to forward bias (D4), whose cathode clamps the gate of the HEMT (Q9) to a potential of V(TOUT)–Vf(D4). This action turns transistor (Q9) OFF—after a slight delay caused by the collective capacitance at the cathode node of diode (D4) caused by transistor (Q9) and diode (D4)—and a turn-OFF sequence for the high-side driver as described in FIG. 6 occurs.

Figure 2B:
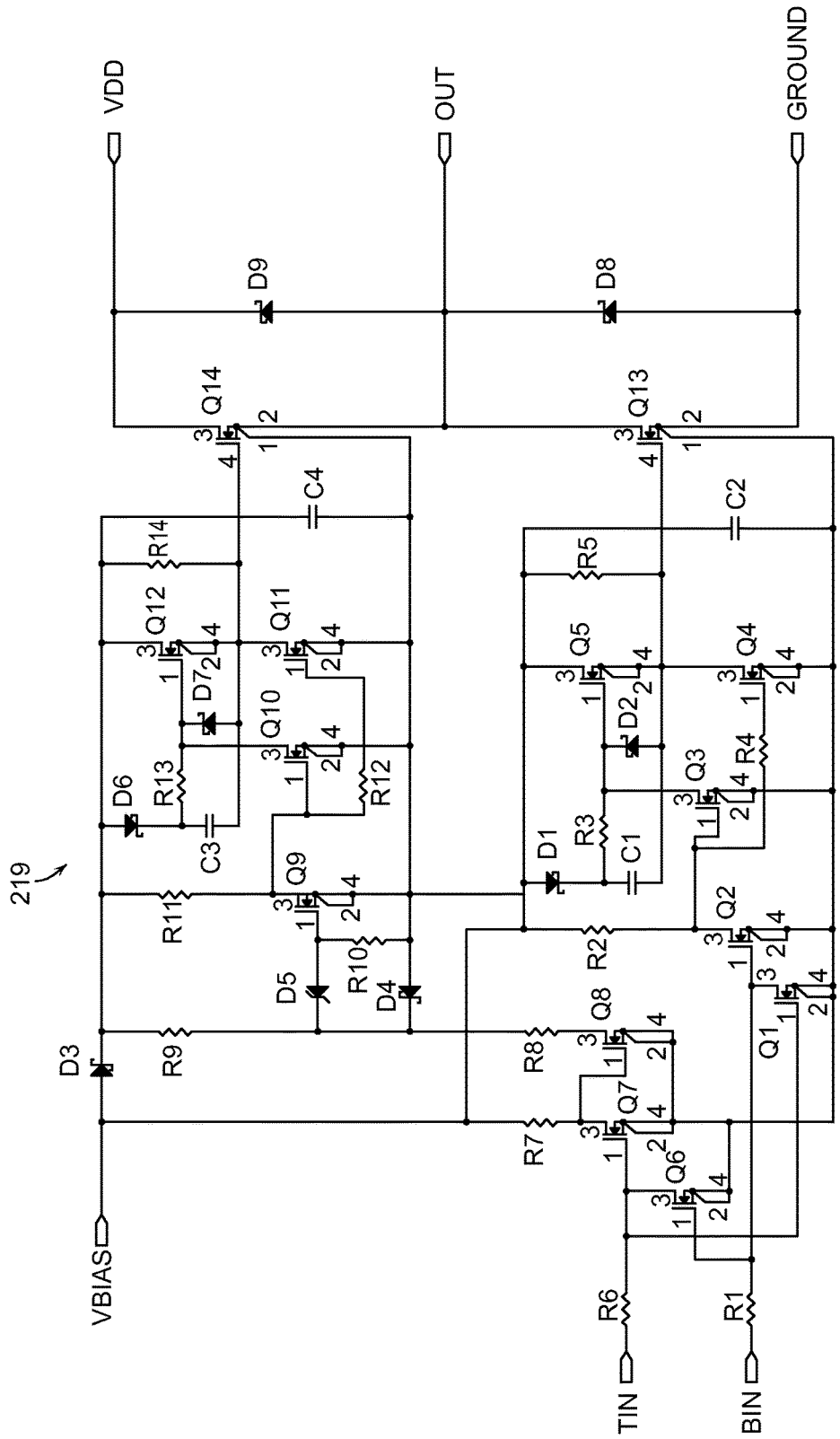
FIG. 2B is a circuit diagram of an enhancement mode GaN HEMT half bridge circuit configuration according to an example embodiment of the present disclosure.

FIG. 2B is a circuit diagram of a multi-function circuit (e.g., the circuit 100 of FIG. 1) that is in a half-bridge driver circuit configuration 201. In this example, the half-bridge circuit 201 is configured as a discrete circuit and each of the of transistors 'Qx', diodes 'Dx', capacitors 'Cx', and resistors 'Rx' are discrete components arranged to form the discrete half-bridge circuit 201. Further, each of the transistors 'Qx' are GaN High Electron Mobility Transistors (HEMTs). Each of the transistors 'Qx' can also be configured as a saturated switch in this configuration of the half-bridge driver circuit 201. The diodes 'Dx' can be Schottky rectifiers with appropriate current and voltage ratings with respect to an intended use of the half-bridge circuit 201. The capacitors 'Cx' are passive ceramic devices and the resistors 'Rx' are passive devices.

The half-bridge driver circuit 201 includes a low-side power switch (Q13) and a high-side power switch (Q14). The circuit 201 is also provided with Schottky "catch" rectifier diodes (D8, D9) connected anti-parallel with each of the power switches (Q13, Q14). These catch rectifier diodes (D8, D9) catch the voltage excursions of an output terminal (OUT) when load current either flows out of diode (D8) or into diode (D9), the output terminal (OUT) and both power switches (Q13, Q14) are in an OFF-state. The high-side power switch (Q14) is referenced to a high voltage power supply (VDD). The low-side power switch (Q13) is referenced to a ground terminal (GROUND).

The low-side power switch (Q13) is electrically coupled to low-side circuitry 217. The low-side circuitry 217 includes transistors (Q1-Q5) that are configured as power driver for driving the low-side power switch (Q13). In particular, the transistors (Q1-Q5) and associated active and passive components are configured as a high speed gate driver for the power switch (Q13). For instance, the low-side circuitry 217 includes a control gate that includes a switch driver (Q5, Q4), bootstrap circuit/bias control (D1, R3, C1), state controller (Q2, Q3), and an inverter (Q1). The control gate is configured to drive the low-side power switch (Q13). In this implementation, the components of the control gate are arranged as a subordinate half-bridge driver that is configured to drive the power switch (Q13).

For example, the subordinate half-bridge driver includes the switch drive transistors (Q5, Q4). The transistor (Q5) is effectively a low-side subordinate half bridge high-side power switch. This subordinate half-bridge high-side power switch (Q5) is configured to drive the low side power switch (Q13). A state of the low-side subordinate half bridge high-side power switch (Q5) is controlled by the bootstrap circuit (D1, R3, C1). The bootstrap circuit (D1, R3, C1) is configured as a charge pump for the low-side subordinate half bridge high-side power switch (Q5).

A state controller (Q2, Q3) is in electrical communication with the switch drivers (Q5, Q4) and is configured to control their state. In particular, they are configured to act as a "shoot-through" or cross-conduction prevention device to prevent both of the switch drivers (Q5, Q4) to be turned on at the same time.

Similarly, the transistor (Q1) is configured to prevent the low side power driver 217 from being turned on when a high side power driver 219 has been turned on.

In addition, the low-side circuitry 217 includes a bypass capacitor (C2), which is in electrical communication with the low-side power switch (Q13). The bypass capacitor (C2) is configured as a high frequency power supply "bypass" capacitor to provide high frequency charge storage for the low-side gate driver circuit 217.

The high-side power switch (Q14) is electrically coupled to high-side circuitry 219. The high-side circuitry 219 includes transistors (Q6-Q12) that are configured as a power driver for driving the high-side power switch (Q14). In particular, the transistors (Q6-Q12) and associated active and passive components (e.g., the capacitors, resistors, and diodes) are configured as a high speed gate driver for power switch (Q14). For instance, the high-side circuitry 219 includes a high-side control gate that includes a high-side switch driver (Q12, Q11), high-side bootstrap circuit/bias control (D6, R13, C3), high-side state controller (Q9, Q10), and a high-side inverter (Q7). The high-side control gate is configured to drive the high-side power switch (Q14). In this implementation, the components of the control gate are arranged as a high-side subordinate half-bridge driver that is configured to drive the power switch (Q14).

For example, the high-side subordinate half-bridge driver includes the switch drive transistors (Q12, Q11). The transistor (Q12) is effectively a high-side subordinate half bridge high-side power switch. This high-side subordinate half-bridge high-side power switch (Q12) is configured to drive the high side power switch (Q14). A state of the high-side subordinate half bridge high-side power switch (Q12) is controlled by the bootstrap circuit (D6, R13, C3). The bootstrap circuit (D6, R13, C3) is configured as a charge pump for the high-side subordinate half bridge high-side power switch (Q12).

The high-side state controller (Q9, Q10) is in electrical communication with the high-side switch drivers (Q12, Q11) and is configured to control their state. In particular, they are configured to act as a "shoot-through" or cross-conduction prevention device to prevent both of the switch drivers (Q12, Q11) to be turned on at the same time.

The transistor (Q6) is configured to prevent the high-side power driver 219 from being turned on when the low-side power driver 217 has been turned on.

In addition, the high-side circuitry 219 includes a bypass capacitor C4 is in electrical communication with the high-side power switch (Q14). The bypass capacitor (C4) is configured as a high frequency power supply "bypass" capacitor to provide high frequency charge storage for the high-side gate driver circuit 219. The capacitor C4 is also configured as a bootstrap capacitor configured to store sufficient charge to provide a transient bias potential to the high-side power driver at times when Q14 is on and C4 has no electrical connection to ground.

Figure 2C:
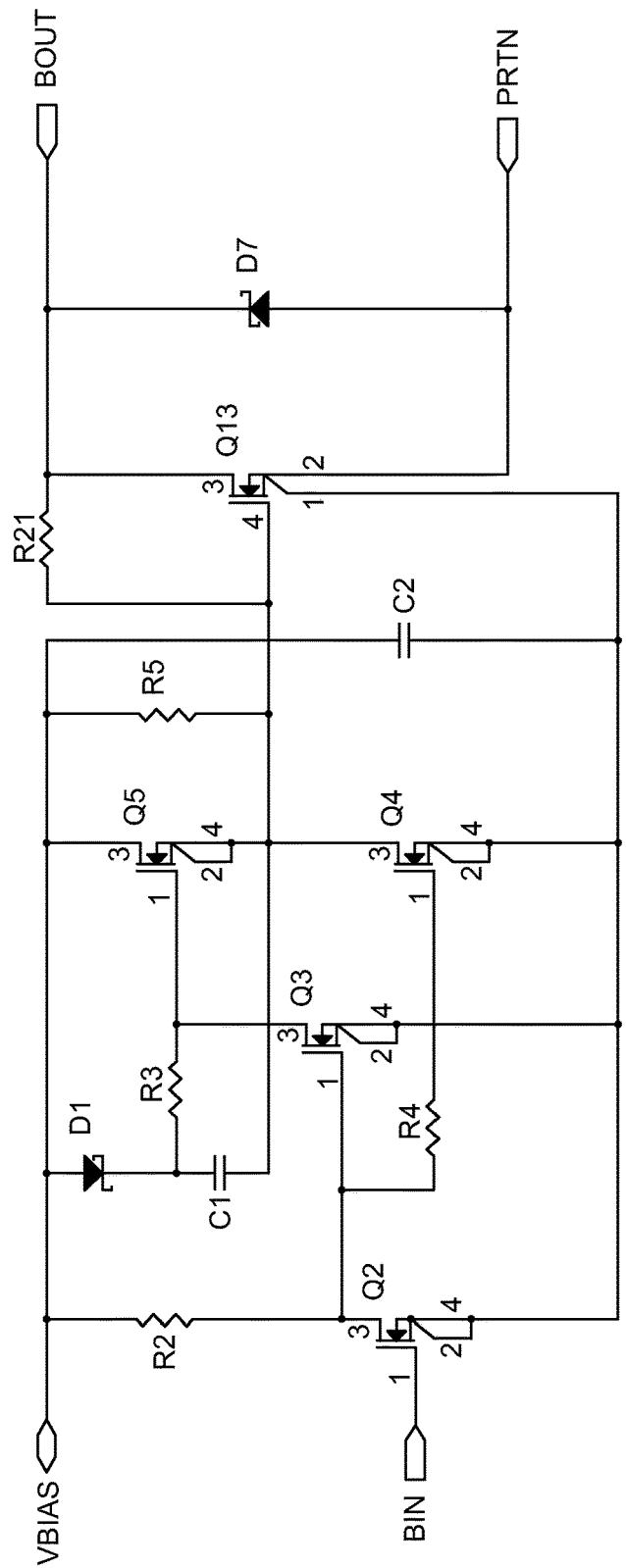
FIG. 2C is a circuit diagram of an enhancement mode GaN HEMT low-side driver circuit configuration according to an example embodiment of the present disclosure.

FIG. 2C illustrates a low-side driver 216a that is configured to drive a low-side power switch (Q13). In this example, the low-side driver 216a is configured as a discrete circuit and corresponds to the low-side circuitry 216 of FIG. 2A. In addition, each of the transistors 'Qx', diodes 'Dx', capacitors 'Cx', and resistors 'Rx' are discrete components.

Figure 2D:
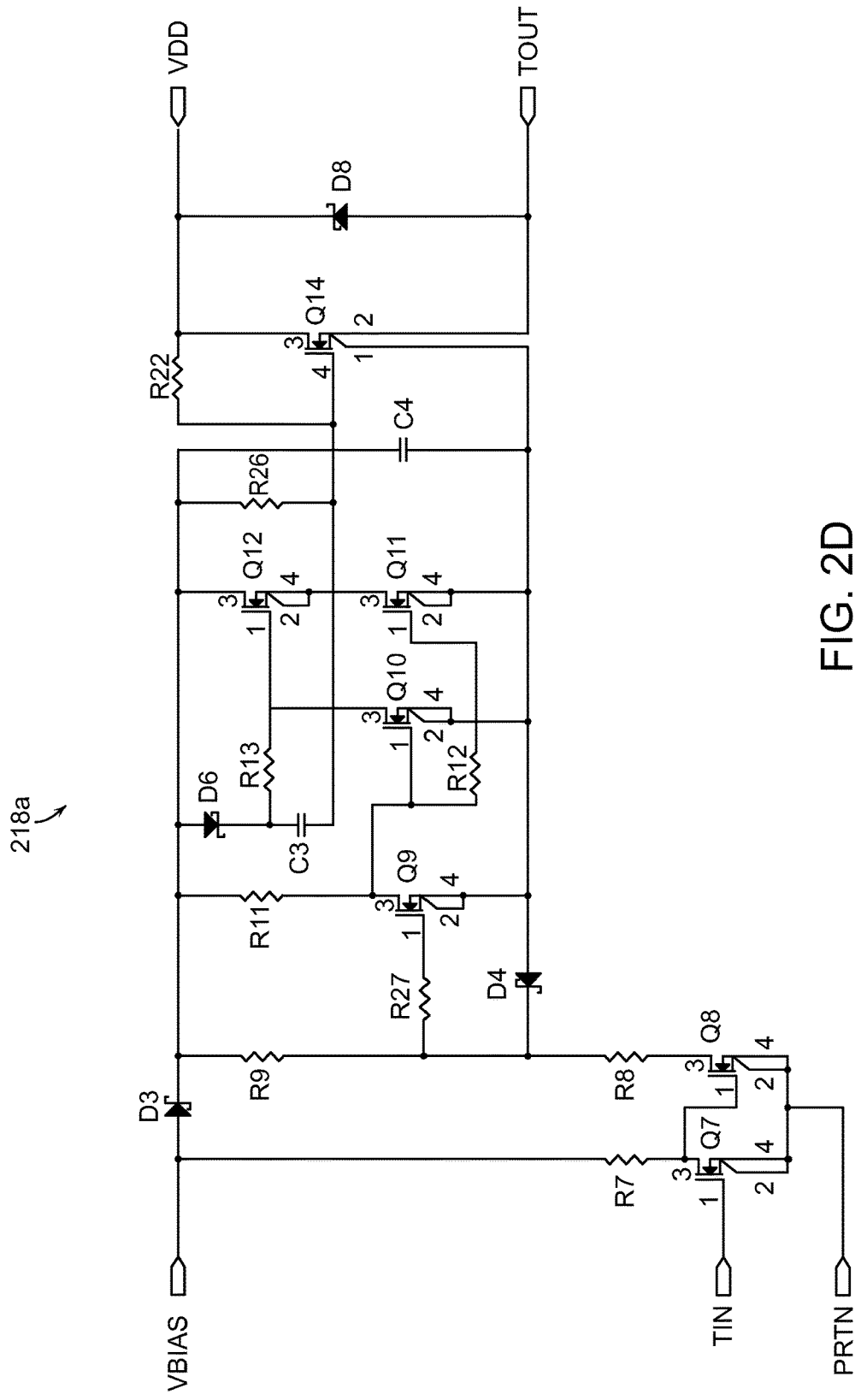
FIG. 2D is a circuit diagram of an enhancement mode GaN HEMT high-side driver circuit configuration according to an example embodiment of the present disclosure.

FIG. 2D illustrates a high-side driver 218a that is configured to drive a high-side power switch (Q14). In this example, the low-side driver 218a is configured as a discrete circuit and corresponds to the high-side circuitry 218 of FIG. 2A. In addition, each of the transistors 'Qx', diodes 'Dx', capacitors 'Cx', and resistors 'Rx' are discrete components.

Figure 2E:
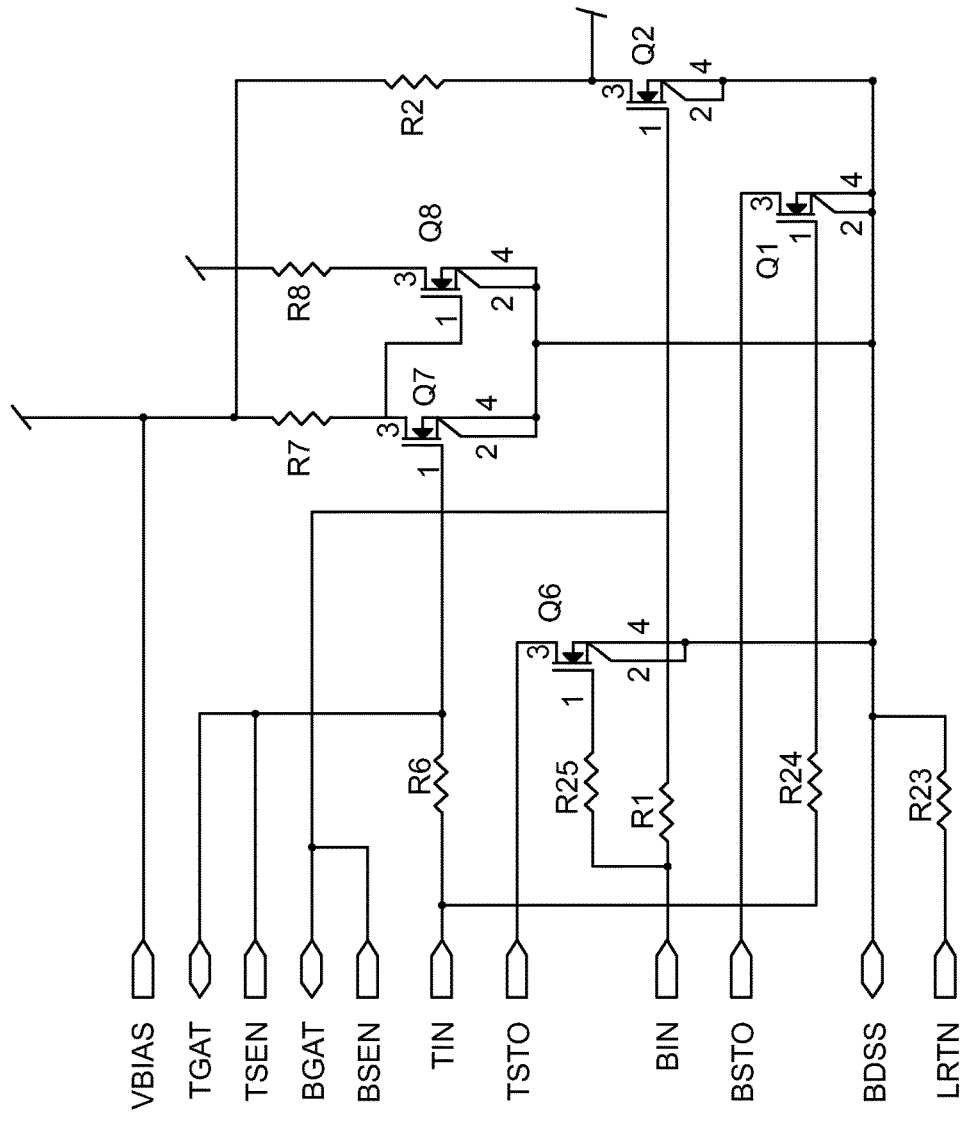
FIG. 2E is a circuit diagram of an enhancement mode GaN HEMT shoot through protection circuit configuration according to an example embodiment of the present disclosure.

FIG. 2E illustrates a shoot-through protection circuit 205 that can be used with the multi-function circuit 200 of FIG. 2A. The shoot-though protection circuit 205 is composed of transistors a GaN HEMT inverter (Q1) and GaN HEMT state control (Q6). Additionally, the shoot-though protection circuit includes bias and timing resistors (R1, R6, R24 and R25).

When the multi-function 200 circuit is connected in a half bridge configuration, the terminal "BOUT" is connected to the terminal "TOUT". A terminal "BSTO" is connected to the terminal "BSEN". Also, the terminal "TSTO" is connected to the terminal "TSEN". The GaN HEMT inverter (Q1) monitors a logic state of an input signal at the terminal "TIN" via resistor (R24). Similarly, the GaN HEMT state control (Q6) monitors a logic state of an input signal at the terminal "BIN" via resistor (R25). When either input is at a high logic state (e.g. a potential sufficient to exceed Vgs(th)), then the corresponding GaN HEMT monitor (Q1 or Q6) is on.

Accordingly, when either the GaN HEMT is on, the shoot-through protection circuit 205 effectively provides a low resistance connection to a voltage potential of the terminal "BDSS" (i.e., ground). If both terminal "BIN" and terminal "TIN" are at a high logic state, then both GaN HEMT monitors (Q1 and Q6) are in an on state. Thus, with the terminal "BSTO" connected to the terminal "BSEN" and the terminal "TSTO" connected to the terminal "TSEN", a high logic state corresponding to either the terminal "TIN" or the terminal "BIN" causes the gates of Q2 and Q7 to be effectively grounded, turning off both the GaN HEMT state controller (Q2) and the GaN HEMT high-side inverter (Q7). As described herein, with the GaN HEMT state controller (Q2) and the GaN HEMT high-side inverter (Q7) off, the corresponding GaN HEMT power switch (Q13) and the corresponding GaN HEMT power switch (Q14) is also be in the off state. Thus, with both GaN HEMT power switches (Q13 and Q14) off, no current may flow into the circuit 200. Thus, the half bridge circuit 200 is protected from a deleterious shoot-through condition, defined as both the low and high side power drivers on simultaneously.

In the circuit shown in FIG. 2E, resistors R1 and R6 are current-limiting resistors for the switch drive inputs "BIN" and "TIN" for the condition when either Q1 or Q6 is on. Resistors R24 and R25 are timing/decoupling elements along with the Ciss of Q1 and Q6, respectively. The presence of R1, R6, R24 and R25 also prevent an unintentional latch-up condition from occurring, as would be the case if they were not present in the circuit, as the cross-connected transistors Q1, Q2, Q6 and Q7 form a latching circuit. The presence of R1, R6, R24 and R25 ensures that this latching mechanism never exists and that both Q13 and Q14 are off and not conducting current when both inputs "BIN" and "TIN" are at a high logic state.

Figure 3:
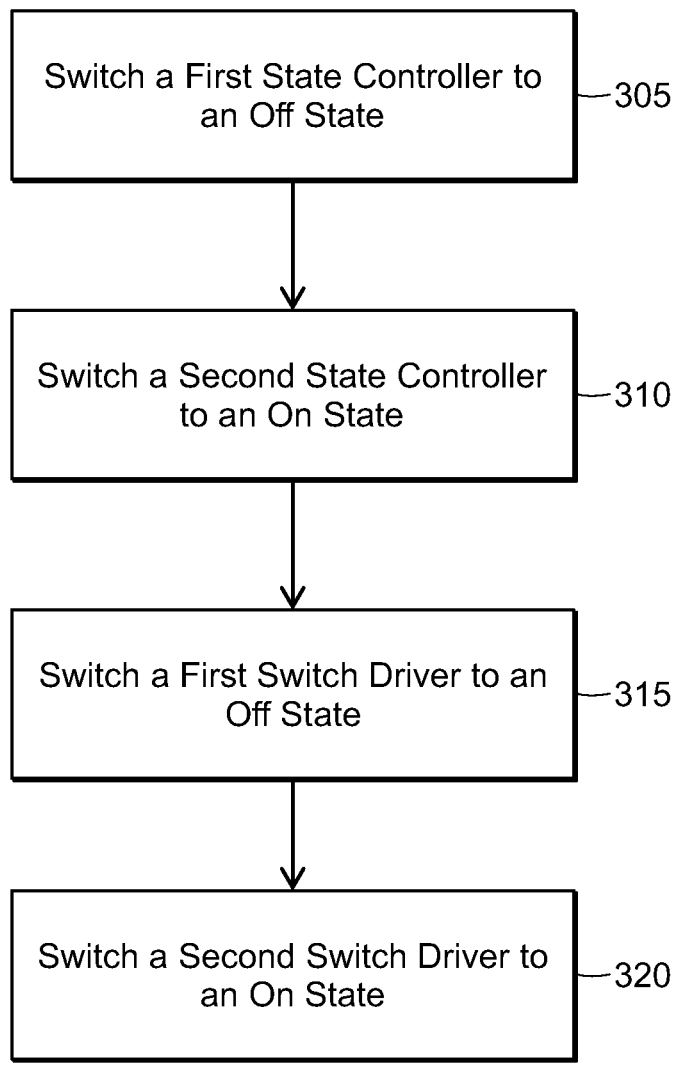
FIG. 3 is a flow chart of a method for turning 'OFF' a low-side gate driver in accordance with an example embodiment of the present disclosure.

FIG. 3 is a flow chart of a method 300 for turning 'OFF' a low-side gate driver 216 of FIG. 2A. The method 300, at 305, includes switching the first state controller (Q2) to an OFF state. For instance, the transistor (Q2) is a connected as a buffer/inverter between a voltage input ('BIN') and the remainder of the low side gate driver circuit 216.

When the voltage at the voltage input ('BIN') input is caused to be less than the turn on voltage (Vgs(th)) of the transistor (Q2), the transistor (Q2) is caused to be OFF and the gates of the transistors (Q3) and (Q4) are pulled up to the voltage terminal (VBIAS) by resistor (R2), causing the state controller (Q3) and the transistor (Q4) to be turned ON. Accordingly, the method 300, at 310, includes switching the second state controller (Q3) to an 'ON' state.

Resistor (R2) and the input capacitance, Ciss, of transistor (Q3) cause a small time delay (td1) in the turn ON of the transistor (Q3). The series combination of resistor (R2), resistor (R4), and the Ciss of transistor (Q4) causes a slightly longer time delay (td2>td1) in the turn ON of transistor (Q4). Accordingly, the method 300, at 315, includes, with transistor (Q3) ON, causing the gate of transistor (Q5) to be pulled to GROUND by the drain of transistor (Q3). Additionally, at 315, the method 300 includes causing the transistor (Q5) to be turned OFF. The turn OFF of transistor (Q5) has a very short delay time (td3) which is determined by the ON-state resistance of the transistor (Q3) and the input capacitance, Ciss, of transistor (Q5). The turn OFF time of the transistor (Q5) is such that td3<<td2, and the transistor (Q5) turns OFF before the transistor (Q4) turns ON, thus preventing VBIAS-to-GROUND shoot through current from flowing as in the case if both transistors (Q4) and (Q5) were ON simultaneously. Schottky diode (D2) acts to clamp the gate-source reverse voltage to −Vf(D2) when transistor (Q3) turns ON. This clamping action prevents voltage-induced damage to the gate of (Q5) during the OFF switching event of (Q5).

At 320, the method 300 includes turning on transistor switch (Q4). With transistor (Q4) ON, the gate of (Q13) is below Vgs(th) due to the low ON resistance of (Q4), causing power switch (Q13) to be OFF. Additionally, a bottom terminal of capacitor (C1) is connected to GROUND by the ON-state of transistor (Q4). This action causes capacitor (C1) to be charged to a voltage whose magnitude is approximately VBIAS−Vf(D1). This capacitor (C1), colloquially known as a "bootstrap" capacitor by those skilled in the practice, is now pre-charged in anticipation of an ON event for transistor (Q5). In particular, the capacitor (C1) provides transient gate-source turn-ON potential for transistor (Q5). During the turn-OFF event, timing resistor (R3) draws a DC current from VBIAS to GROUND though diode (D1) and the transistor (Q3). Also during the turn-OFF event, DC resistor (R5) draws a DC current from VBIAS to GROUND through transistor (Q4).

Figure 4:
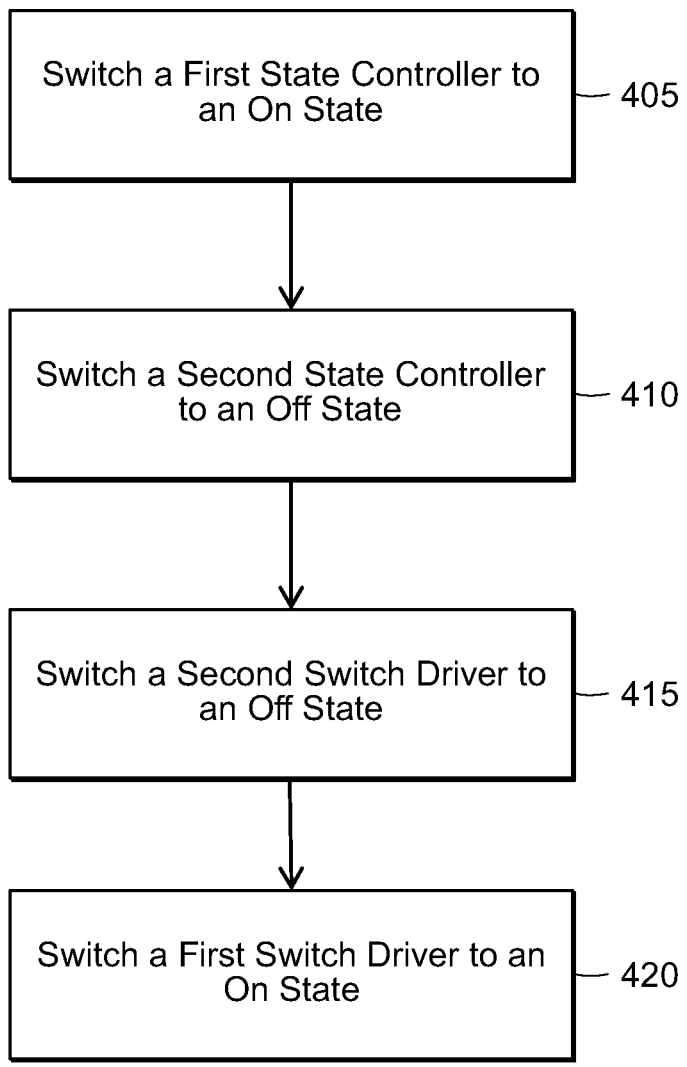
FIG. 4 is a flow chart of a method for turning 'ON' a low-side gate driver in accordance with an example embodiment of the present disclosure.

FIG. 4 is a flow chart of a method 400 for turning 'ON' a low-side gate driver 216 of FIG. 2A. When the voltage at the BIN input terminal is caused to be greater than Vgs(th) of (Q2), the transistor (Q2), at 405 of method 400, is caused to be ON and thus causing the drain of (Q2) to assume a potential at or near GROUND. This causes the gate of (Q3), at 410 of method 400, to be connected to GROUND, causing (Q3) to be OFF, and the gate of (Q4) to be connected to GROUND (through R4) causing (Q4), at 415 of method 400, to be OFF. The turn OFF delay (td4) for (Q3) is very small due to the very low ON-state resistance of (Q3). The turn-OFF delay (td5) of (Q4) is longer than that of Q3 (td5>td4) due to the presence of (R4). When (Q3) turns OFF, the gate of (Q5) is caused to rise towards the potential V(C1) via the time constant (td6) determined by the resistor (R3) and the input capacitance, Ciss, of transistor (Q5). In order to prevent VBIAS-to-GROUND shoot-through current, the delay time td6 is chosen to be greater than delay time td5 by the choice of resistor values (R3) and (R4).

When the gate of transistor (Q5) becomes greater than the Vgs(th) of (Q5), then (Q5), at 420 of method 400, turns ON and the gate of the power switch (Q13) is caused to be connected to the potential VBIAS, which is greater than the Vgs(th) of (Q13). Thus, power switch Q13 is turned ON.

With (Q5) ON, a bottom terminal of capacitor (C1) is caused to be connected to input terminal VBIAS. Since the potential across the capacitor (C1) cannot change instantaneously, the potential at the top terminal of (C1) is caused to assume the potential (2*VBIAS)−Vf(D1). Thus, the potential provided to the gate of (Q5) is ((2*VBIAS)−Vf(D1))−VBIAS, which is a value greater than Vgs(th) of (Q5). Additionally, diode D1 is caused to be reverse-biased by the amount ((2*VBIAS)−Vf(D1))−VBIAS. Until the capacitor (C1) is discharged to below Vgs(th) of transistor (Q5) in an OFF-state, a reverse-bias leakage current of transistor (Q5) will remain ON. Resistor (R5) is included to pull the gate of (Q13) to VBIAS, a potential greater than Vgs(th) of (Q13), to keep (Q13) ON even for long term, DC, events.

Figure 5:
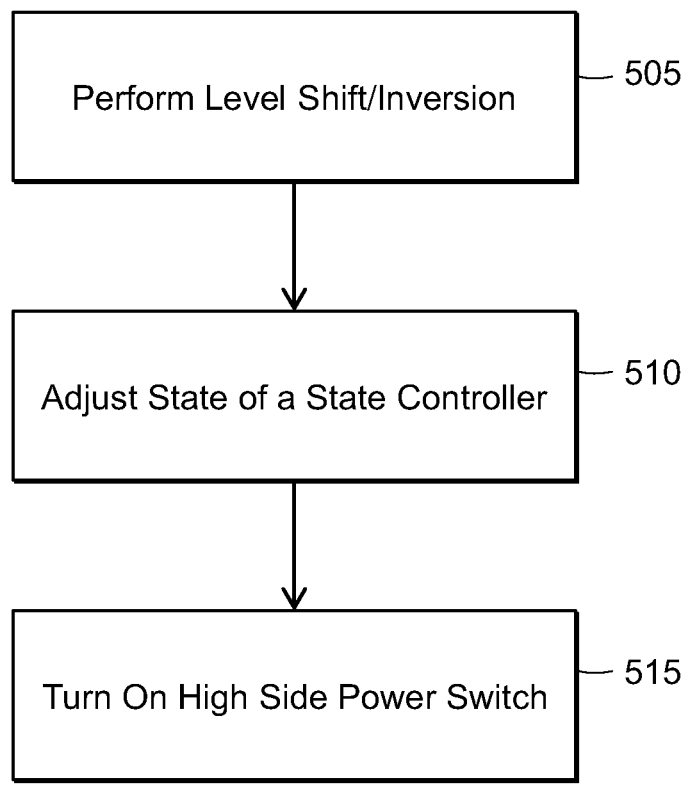
FIG. 5 is a flow chart of a method for turning 'ON' a high-side gate driver in accordance with an example embodiment of the present disclosure.

FIG. 5 is a flow chart of a method 500 for turning 'ON' the high-side gate driver 218 of FIG. 2A.

When the gate of transistor (Q8) is pulled to GROUND, transistor (Q7), at 505 of method 500, is caused to be turned ON. Accordingly, current ceases to flow in the resistor (R8) and the gate of transistor (Q9), at 510 of method 500, is caused to become forward-biased by resistors (R9) and (R27). The voltage between the gate and source terminals of (Q9) is approximately:

$$Vgs(Q9)=VBIAS-Vf(D3) \tag{EQ 1}$$

So long as the Vgs described by EQ 1 is greater than Vgs(th) of transistor (Q9), (Q9) is successfully turned ON and ultimately power switch (Q14), at 515 of method 500, is turned ON. Diode (D4) is also reverse-biased by the amount shown in EQ1.

During the turn-ON event, there is a small delay time (td7) that occurs due to resistor (R9) charging a barrier capacitance of (D4) and the input capacitance, Ciss, of transistor (Q9). This delay forms a part of a total throughput delay time of the high-side gate driver 218.

Figure 6:
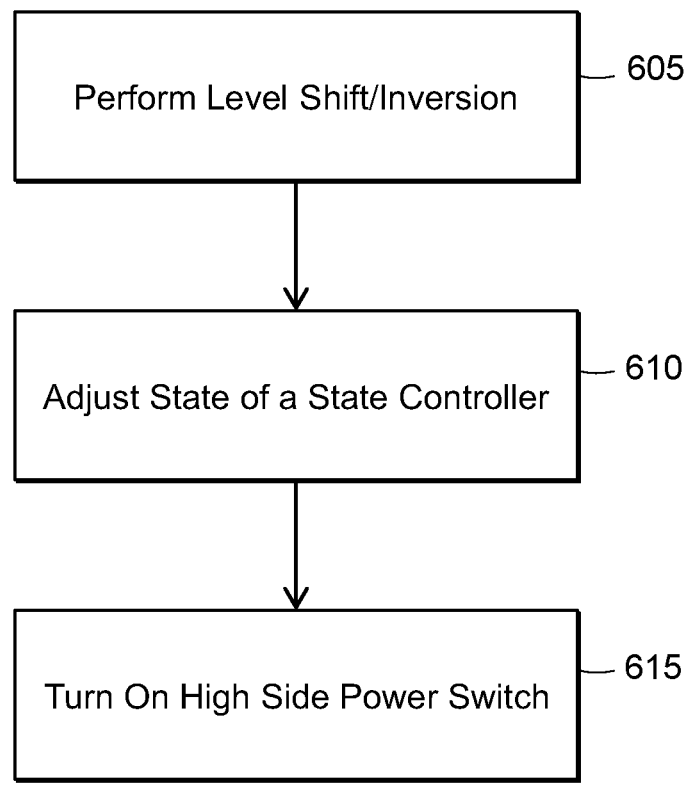
FIG. 6 is a flow chart of a method for turning 'OFF' a high-side gate driver in accordance with an example embodiment of the present disclosure.

FIG. 6 is a flow chart of a method 600 for turning 'OFF' a high-side gate driver 218 of FIG. 2A.

When transistor (Q7) is forced to turn OFF, the transistor (Q8), at 605 of method 600, is caused to turn ON, thus providing a bias path from the top driver 218 to GROUND via resistor (R8), which is in series with the ON-state resistance of transistor (Q8). The potential at the cathode of (D5) falls from its initial value until it is clamped by diode (D4) at the potential V(TOUT)−Vf(D4). The potential at the cathode of (D4/D5) loiters at the potential V(TOUT)−V(D4) for a time equivalent to the high-side gate driver delay time and the OFF switching time of transistor (Q14). When this turn OFF event is complete, the voltage at the TOUT terminal will have fallen to the potential −Vf(D8) (assuming current flows out of the TOUT terminal), and the potential at the cathode of D4 will have fallen to:

$$V(Cathode(D4)) = \frac{(VBIAS - Vf(D3)) * R8}{(R8 + R9)} \tag{EQ 2}$$

The voltage at the cathode of D4 is essentially the voltage at the gate of Q9 (Vgs(Q9)), and so long as Vgs(Q9) is less than Vgs(th) of Q9, the transistor (Q9), at 610 of method 600, is in the OFF-state. Accordingly, power switch (Q14), at 615 of method 600, is caused to turn OFF. When the voltage at the cathode of (D4) is described by EQ 2, diode (D4) is provided a reverse-biased potential in the amount:

$$V(D4)=-(V(Cathode(D4))+Vf(D8)) \tag{EQ 4}$$

While the present disclosure has been particularly shown and described with references to example embodiments thereof, it will be understood by those skilled in the art that various changes in form and details may be made therein without departing from the scope of the present disclosure encompassed by the appended claims.

What is claimed is:
1. A multi-function circuit comprising:
   a low side circuit comprising a first set of enhancement mode transistors; and
   a high side discrete circuit comprising a second set of enhancement mode transistors;

wherein each enhancement mode transistor of both the first and the second sets of enhancement mode transistors is a GaN high electron mobility transistor (HEMT) configured to be an active switching element;

wherein the high side discrete circuit comprises a high side switch control gate forming a high side subordinate half bridge circuit configured to directly drive a GaN high side power switch, the high side subordinate half bridge circuit comprises:

a high side subordinate half bridge high side switch and a high side subordinate half bridge low side switch;

a state controller comprising a first transistor and a second transistor in electrical communication with the high side subordinate half bridge high side switch and the high side subordinate half bridge low side switch, wherein the state controller is configured to at least determine ON/OFF logic state information of the high side subordinate half bridge circuit; and a first bootstrap circuit in electrical communication with at least the high side subordinate half bridge high side switch, wherein the first bootstrap circuit is configured to act as a charge pump to control, in combination with the first transistor of the state controller, an on/off state of the high side subordinate half bridge high side switch.

2. The multi-function circuit of claim 1, wherein the low side circuit includes a GaN low side power switch having a low side switch control gate, the low side switch control gate forming a low side subordinate half bridge circuit configured to directly drive the GaN low side power switch.

3. The multi-function circuit of claim 2, further comprising a first rectifier diode and a second rectifier diode, the first and second rectifier diodes having an anti-parallel configuration with respect to both the GaN low side power switch and the GaN high side power switch.

4. The multi-function circuit of claim 3, wherein the low side subordinate half bridge circuit includes a low side subordinate half bridge high side switch.

5. The multi-function circuit of claim 4, further comprising a second bootstrap circuit in electrical communication with the low side subordinate half bridge high side switch, the second bootstrap circuit configured to act as a charge pump to control an on/off state of the low side subordinate half bridge high side switch.

6. The multi-function circuit of claim 5 further comprising a bias path from a voltage bias input terminal through the second bootstrap circuit to a low side subordinate half bridge low side switch, the bias path configured to charge a capacitor of the second bootstrap circuit for controlling the on/off state of the low side subordinate half bridge high side switch.

7. The multi-function circuit of claim 6 further comprising a delay circuit connecting the second bootstrap circuit to the low side subordinate half bridge high side switch, the delay circuit configured to control a timing of a change in the on/off state of the low side subordinate half bridge high side switch in response to a change in the on/off state of the low side subordinate half bridge low side switch.

8. The multi-function circuit of claim 7 further comprising a capacitor bypass circuit in electrical communication with a drain of the low side subordinate half bridge high side switch and a source of the low side subordinate half bridge low side switch, the capacitor bypass circuit configured to provide high frequency charge storage for a current required by the GaN HEMT low side power switch.

9. The multi-function circuit of claim 8 wherein the capacitor bypass circuit is in electrical communication with a bias power supply and is configured to utilize a voltage blocking diode to provide a charging path to ground potential for the capacitor of the bootstrap circuit; and wherein the voltage blocking diode is configured to conduct capacitor charging current when a high side power switch is off, the voltage blocking diode further configured to block bypass capacitor discharge current when the high side power switch is on.

10. The multi-function circuit of claim 1, wherein the high side subordinate half bridge circuit includes a bias controller in electrical communication with the high side subordinate half bridge high side switch, the bias controller configured to electrically communicate ground potential-based state control and timing signal delays to the high side subordinate half bridge via a state controller circuit.

11. The multi-function circuit of claim 1 further comprising a voltage level-shifter/inverter configured to provide OFF/ON state information from a ground potential-based logic control input in electrical communication with the high side power switch driver, the voltage level-shifter/inverter configured to control an OFF/ON state of the GaN high side power switch.

12. The multi-function circuit of claim 1 wherein an entirety of the multi-function circuit is comprised of discrete enhancement-mode GaN circuitry.

13. The multi-function circuit of claim 1 wherein the low side circuit is a discrete circuit.

14. A multi-function circuit comprising:
a low side circuit including a GaN-based low side subordinate half bridge circuit; and
a high side discrete circuit including a GaN-based high side subordinate half bridge circuit;
wherein each enhancement mode transistor of both the low side circuit and the high side discrete circuit is configured to be an active switching element;
wherein the GaN-based high side subordinate half bridge circuit is configured to directly drive a GaN high side power switch, the GaN-based high side subordinate half bridge circuit comprises:
a high side subordinate half bridge high side switch and a high side subordinate half bridge low side switch;
a state controller comprising a first transistor and a second transistor in electrical communication with the high side subordinate half bridge high side switch and the high side subordinate half bridge low side switch, wherein the state controller is configured to at least determine ON/OFF logic state information of the high side subordinate half bridge circuit; and
a first bootstrap circuit in electrical communication with at least the high side subordinate half bridge high side switch, wherein the first bootstrap circuit is configured to act as a charge pump to control, in combination with the first transistor of the state controller, an on/off state of the high side subordinate half bridge high side switch.

15. A multi-function circuit comprising:
a GaN-based low side circuit including:
a GaN-based low side switch having a low side switch control gate, the low side switch control gate forming a low side subordinate half bridge circuit, and
a GaN-based low side switch driver having an output connected to the low side switch control gate; and
a GaN-based high side discrete circuit including:
a GaN-based high side switch having a high side switch control gate, the high side switch control gate forming a high side subordinate half bridge circuit, and a GaN-based high side switch driver having an output connected to the high side switch control gate, wherein the GaN-based high side switch driver comprises:
 a high side subordinate half bridge high side switch and a high side subordinate half bridge low side switch;
 a state controller comprising a first transistor and a second transistor in electrical communication with the high side subordinate half bridge high side switch and the high side subordinate half bridge low side switch, wherein the state controller is configured to at least determine ON/OFF logic state information of the high side subordinate half bridge circuit; and
 a first bootstrap circuit in electrical communication with at least the high side subordinate half bridge high side switch, wherein the first bootstrap circuit is configured to act as a charge pump to control, in combination with the first transistor of the state controller, an on/off state of the high side subordinate half bridge high side switch;
wherein each enhancement mode transistor of both the GaN-based low side circuit and the GaN-based high side discrete circuit is a GaN high electron mobility transistor (HEMT) configured to be an active switching element.

* * * * *